US009715994B2

(12) United States Patent
 Yasui (10) Patent No.: US 9,715,994 B2
(45) Date of Patent: Jul. 25, 2017

(54) CHARGED PARTICLE BEAM DRAWING APPARATUS, FORMAT CHECK APPARATUS AND FORMAT CHECK METHOD

(71) Applicant: NuFlare Technology, Inc, Yokohama (JP)

(72) Inventor: Kenichi Yasui, Yokohama (JP)

(73) Assignee: NuFlare Technology, Inc, Yokohama (JP)

( * ) Notice: Subject to any disclaimer, the term of this patent is extended or adjusted under 35 U.S.C. 154(b) by 221 days.

(21) Appl. No.: 14/263,160

(22) Filed: Apr. 28, 2014

(65) Prior Publication Data
US 2014/0319384 A1   Oct. 30, 2014

(30) Foreign Application Priority Data
Apr. 30, 2013   (JP) .................................. 2013-095032

(51) Int. Cl.
*A61N 5/00* (2006.01)
*H01J 37/317* (2006.01)

(52) U.S. Cl.
CPC ................................ *H01J 37/3174* (2013.01)

(58) Field of Classification Search
CPC .............. H01J 37/3174; H01J 37/3175; H01J 37/3177; H01J 37/3178
USPC .................... 250/492.1, 492.2, 492.22, 492.3
See application file for complete search history.

(56) References Cited

U.S. PATENT DOCUMENTS

2006/0289797 A1* 12/2006 Inanami ................. B82Y 10/00
                                                    250/492.2
2008/0046787 A1*  2/2008 Anpo ..................... B82Y 10/00
                                                    714/701

FOREIGN PATENT DOCUMENTS

JP         2008-34439        2/2008

* cited by examiner

*Primary Examiner* — Jason McCormack
(74) *Attorney, Agent, or Firm* — Oblon, McClelland, Maier & Neustadt, L.L.P.

(57) ABSTRACT

A charged particle beam drawing apparatus in an embodiment includes an information generation part to generate encoded information on drawing data having a layered structure and check information on the format check, if the drawing data passes the check by the format check part; an information storage part to store the encoded information and the check information; a code inspection part to inspect the drawing data by using the encoded information in the information storage part, when the drawing data is to be rechecked in the format check based on the check details; an information inspection part to inspect the check information in the information storage part while omitting the format check, if the drawing data passes the inspection by the code inspection part; and a check execution part to execute check with processing details of the format check changed according to the inspection result.

17 Claims, 9 Drawing Sheets

| | NO CHANGE (SAME) | CHECK ITEM CHANGE (ADDITION) | CHECK PARAMETER CHANGE |
|---|---|---|---|
| CHECK DETAILS | cell_max≦128<br>cell_level non<br>0≦data_type≦7 | cell_max≦128<br>cell_level≦3<br>0≦data_type≦7 | cell_max≦64<br>cell_level non<br>0≦data_type≦7 |
| PROCESSING DETAILS | 1. code inspection<br>2. check information file inspection | 1. code inspection<br>2. check information file inspection<br>3. cell_level check<br>4. check information file update<br>5. encoded information file update | 1. code inspection<br>2. check information file inspection<br>3. cell_max check<br>4. check information file update<br>5. encoded information file update |

|  | FIRST | SECOND | THIRD |
|---|---|---|---|
| CHECK DETAILS | cell_max≦128<br>cell_level non<br>0≦data_type≦7 | cell_max≦<u>64</u><br>cell_level≦<u>3</u><br>0≦data_type≦7 | cell_max≦128<br>cell_level <u>non</u><br>0≦data_type≦7 |
| CHECK INFORMATION FILE | [CHECK ITEM]<br>cell_max="ON"<br>cell_level="OFF"<br>data_type="ON"<br>[CHECK PARAMETER]<br>cell_max=128<br>cell_level=non<br>data_type=0-7 | [CHECK ITEM]<br>cell_max="ON"<br>cell_level="<u>ON</u>"<br>data_type="ON"<br>[CHECK PARAMETER]<br>cell_max=<u>64</u><br>cell_level=<u>3</u><br>data_type=0-7 | [CHECK ITEM]<br>cell_max="ON"<br>cell_level="ON"<br>data_type="ON"<br>[CHECK PARAMETER]<br>cell_max=64<br>cell_level=3<br>data_type=0-7 |

| | NO CHANGE (SAME) | CHECK ITEM CHANGE (ADDITION) | CHECK PARAMETER CHANGE |
|---|---|---|---|
| CHECK DETAILS | cell_max≦128<br>cell_level non<br>0≦data_type≦7 | cell_max≦128<br>cell_level≦3<br>0≦data_type≦7 | cell_max≦64<br>cell_level non<br>0≦data_type≦7 |
| PROCESSING DETAILS | 1. code inspection<br>2. check information file inspection | 1. code inspection<br>2. check information file inspection<br>3. cell_level check<br>4. check information file update<br>5. encoded information file update | 1. code inspection<br>2. check information file inspection<br>3. cell_max check<br>(set an error flag) |

|  | NO CHANGE (SAME) | CHECK PARAMETER CHANGE |
|---|---|---|
| CHECK DETAILS | cell_max≦128<br>cell_level non<br>aux_check existence<br>(aux.xml) | cell_max≦128<br>cell_level≦3<br>aux_check existence<br>(aux.xml) change |
| PROCESSING DETAILS | 1. code inspection<br>2. check information file inspection | 1. code inspection<br>2. check information file inspection<br>3. aux_check check<br>4. check information file update<br>5. encoded information file update |

FIG.13

CHARGED PARTICLE BEAM DRAWING APPARATUS, FORMAT CHECK APPARATUS AND FORMAT CHECK METHOD

CROSS-REFERENCE TO THE RELATED APPLICATION

This application is based on and claims the benefit of priority from Japanese Patent Application No. 2013-95032, filed on Apr. 30, 2013; the entire contents of which are incorporated herein by reference.

FIELD

Embodiments described herein relate generally to a charged particle beam drawing apparatus, a format check apparatus and a format check method.

BACKGROUND

Along with recent advancement toward higher integration and lager capacity of large scale integrated circuits (LSI), the circuit line width to be achieved by semiconductor devices has become smaller and smaller. The photolithography technique is used to form desired circuit patterns in semiconductor devices. In this photolithography technique, pattern transfer is performed using a defined pattern called a photomask (reticle). A charged particle beam drawing apparatus having fine resolution is used to produce highly accurate masks to be used for pattern transfer.

In the charged particle beam drawing apparatus, format check is generally performed to check the format of drawing data. This format check is performed on the occasion of data transfer, data copy or the like. In addition, the format check is sometimes performed on the same drawing data with different check requirements (check details). Note that the drawing data is data having a layered structure including a chip layer, a frame layer, a block layer, a cell layer and a figure layer, for example.

In this regard, the data volume of the drawing data having the aforementioned layered structure is so large that the format check of the drawing data requires a long period of time. In addition, if a part of the format check is carelessly omitted in order to shorten the check time, the rigorous check cannot be performed.

DETAILED DESCRIPTION

According to one embodiment of the present invention, a charged particle beam drawing apparatus includes: a format check part configured to perform format check based on check details on drawing data having a layered structure; an information generation part configured to generate encoded information on the drawing data and check information on the format check, if the drawing data passes the check performed by the format check part; an information storage part configured to store the encoded information and the check information generated by the information generation part; a code inspection part configured to inspect the drawing data by using the encoded information stored by the information storage part, when the drawing data is to be rechecked in the format check based on the check details; an information inspection part configured to inspect the check information stored by the information storage part if the drawing data passes the inspection performed by the code inspection part; and a check execution part configured to execute check with processing details of the format check changed according to an inspection result obtained by the information inspection part.

According to another embodiment, a format check apparatus includes: a format check part configured to perform format check based on check details on drawing data having a layered structure; an information generation part configured to generate encoded information on the drawing data and check information on the format check, if the drawing data passes the check performed by the format check part; an information storage part configured to store the encoded information and the check information generated by the information generation part; a code inspection part configured to inspect the drawing data by using the encoded information stored by the information storage part, when the drawing data is to be rechecked in the format check based on the check details; an information inspection part configured to inspect the check information stored by the information storage part if the drawing data passes the inspection performed by the code inspection part; and a check execution part configured to execute check with processing details of the format check changed according to an inspection result obtained by the information inspection part.

According to another embodiment, a format check method includes the steps of: performing format check based on check details on drawing data having a layered structure; generating encoded information on the drawing data and check information on the format check, if the drawing data passes the format check; storing the encoded information and the check information thus generated; inspecting the drawing data by using the stored encoded information when the drawing data is to be rechecked in the format check based on the check details; inspecting the stored check information if the drawing data passes the inspection using the encoded information; and executing check with processing details of the format check changed according to an inspection result of the inspection on the check information.

Various Embodiments will be described hereinafter with reference to the accompanying drawings.

(First Embodiment)

A first embodiment is described with reference to FIGS. 1 to 8.

Figure 1:
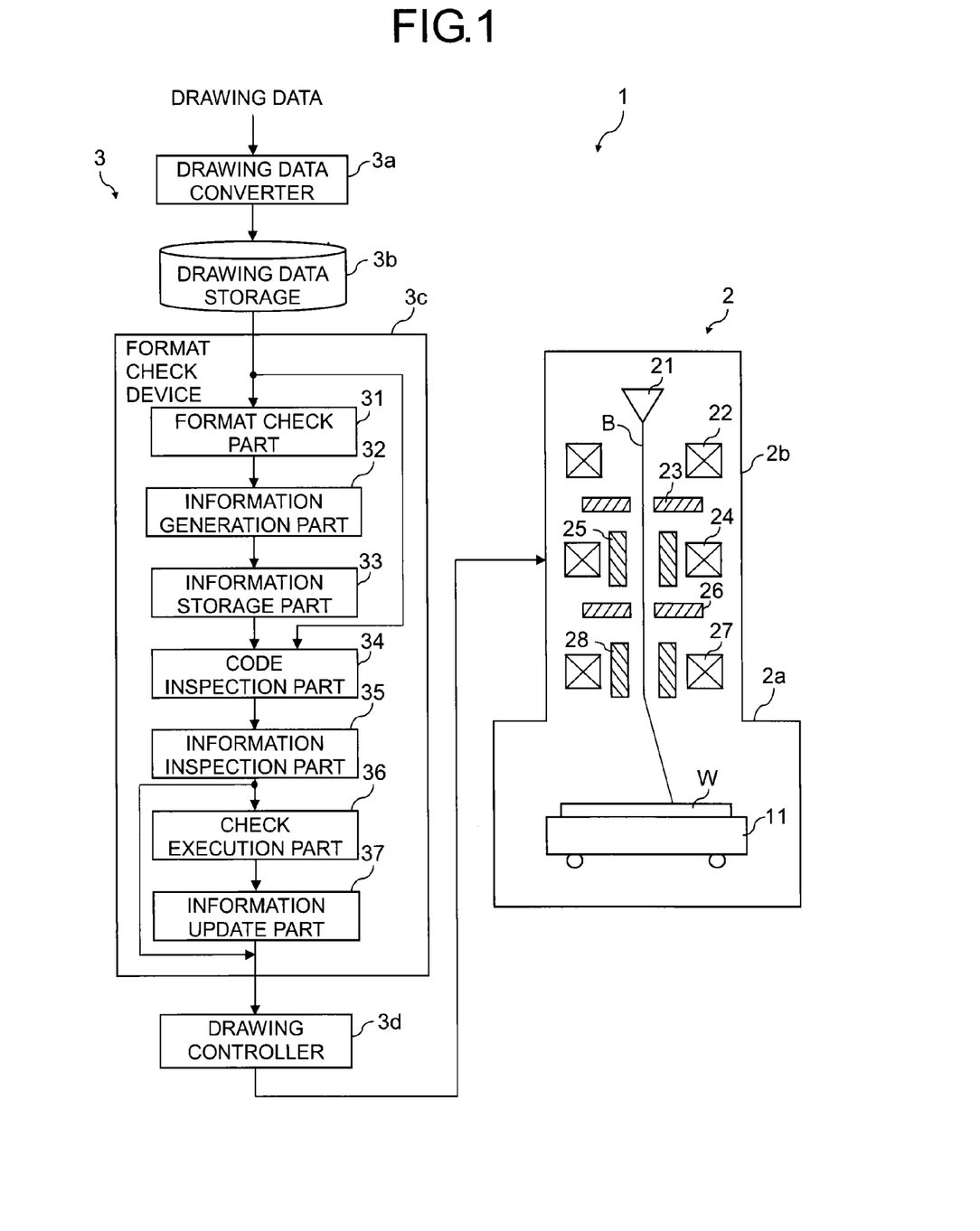
FIG. 1 is a diagram illustrating a schematic configuration of a charged particle beam drawing apparatus according to a first embodiment.

As illustrated in FIG. 1, a charged particle beam drawing apparatus 1 according to the first embodiment includes a drawing unit 2 configured to perform drawing by using a charged particle beam and a controlling unit 3 configured to control the drawing unit 2. The charged particle beam drawing apparatus 1 is one example of a variable-shaped beam drawing apparatus using, for example, an electron beam. It should be noted that the charged particle beam is not limited to the electron beam but may be any other charged particle beam such as an ion beam.

The drawing unit 2 includes a drawing chamber 2a where to accommodate a sample W targeted for drawing, and an optical lens barrel 2b communicating with the drawing chamber 2a. A stage 11 for supporting the sample W is provided inside the drawing chamber 2a. The stage 11 is formed to be movable in an X direction and a Y direction which are orthogonal to each other on a horizontal plane, and has a mounting surface for mounting a sample W such as a mask or a blank, for example. An electron gun 21 configured to emit an electron beam B, an illumination lens 22 configured to condense the electron beam B, a first aperture 23 for beam shaping, a projection lens 24 for projection, a first deflector 25 for beam shaping, a second aperture 26 for beam shaping, an object lens 27 configured to focus the beam on the sample W, and a second deflector 28 configured to control a beam shot position on the sample W are arranged inside the optical lens barrel 2b.

In the drawing unit 2, the electron beam B is emitted from the electron gun 21 and is applied to the first aperture 23 via the illumination lens 22. The first aperture 23 has an aperture in a rectangular shape, for example. With this shape, once the electron beam B passes through the first aperture 23, the electron beam B is formed to have a rectangular cross sectional shape, and then is projected onto the second aperture 26 via the projection lens 24. The projection position can be deflected by the first deflector 25. The shape and the dimensions of the electron beam B can be controlled by changing the projection position. Then, after passing through the second aperture 26, the electron beam B is shot on the sample W mounted on the stage 11 with a focus adjudged via the object lens 27. Here, the shot position of the electron beam B on the sample W mounted on the stage 11 is controlled by the second deflector 28.

The controlling unit 3 includes a drawing data converter 3a configured to convert inputted drawing data into data in a format for drawing apparatus, a drawing data storage 3b configured to store the converted drawing data, a format check device (apparatus) 3c configured to check the format of the converted drawing data, and a drawing controller 3d configured to control the drawing unit 2 on the basis of the checked drawing data.

The drawing data converter 3a converts drawing data to data in the format for drawing apparatus, the drawing data obtained by converting, for example, layout data (design data, CAD data, or the like) of a semiconductor integrated circuit or the like. The drawing data is inputted to the drawing data converter 3a through, for example, a wired or wireless network from a storage device (not illustrated) such as a database where the drawing data is stored.

The drawing data storage 3b is a storage unit to store the drawing data in the format for drawing apparatus, to which the inputted drawing data is converted by the drawing data converter 3a. For example, a magnetic disk device, a semiconductor disk device (flash memory) or the like can be used as the drawing data storage 3b.

The format check device 3c reads the drawing data in the format for drawing apparatus from the drawing data storage 3b on the occasion of the data transfer or the like, and checks the format of the drawing data (the details will be described later). If the drawing data passes the check, the format check device 3c transmits the passed drawing data to the drawing controller 3d in the next stage. On the other hand, if the drawing data fails to pass, the format check device 3c sets an error flag (error notification).

The drawing controller 3d controls the drawing unit 2 on the basis of the drawing data in the format for drawing apparatus transmitted from the format check device 3c. To be more specific, on the basis of the drawing data having passed the check, the drawing controller 3d draws figures at predetermined positions on the sample W mounted on the stage 11 by deflecting and shooting the electron beam B onto the predetermined positions while moving the stage 11 having the sample W mounted thereon in the X direction, for example. Thereafter the drawing controller 3d moves the stage 11 in one step in the Y direction, and then draws figures in the same manner as that described above. By repeating the above operation, the drawing controller 3d performs the drawing on a drawing region of the sample W by using the electron beam B (one example of the drawing operation).

Figure 2:
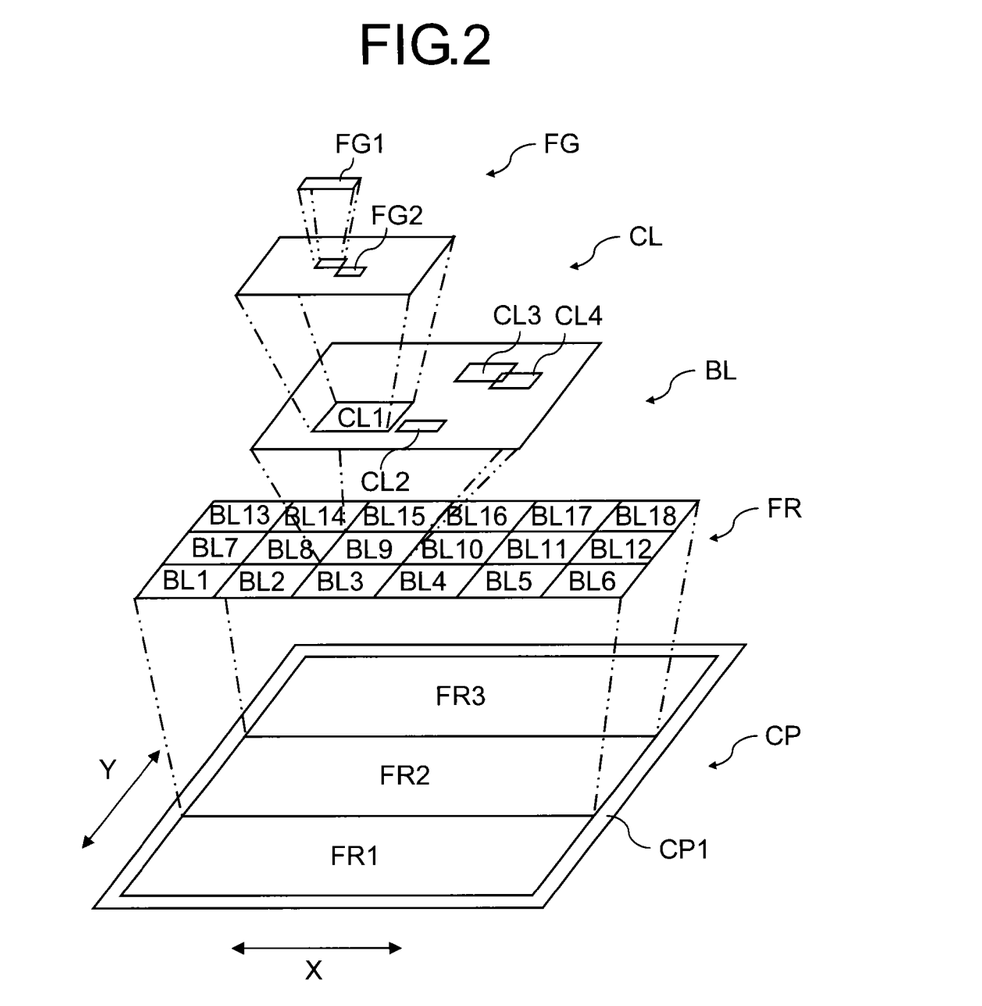
FIG. 2 is an explanatory diagram for explaining drawing data according to the first embodiment.

Here, as illustrated in FIG. 2, the foregoing drawing data is layered in a chip layer CP, a frame layer FR lower than the chip layer CP, a block layer BL lower than the frame layer FR, a cell layer CL lower than the block layer BL, and a figure layer FG lower than the cell layer CL (layered structure). Here, both the drawing data before conversion and the drawing data after conversion have a layered structure. In such drawing data, if a certain layer is defined as a first layer, a layer immediately below the first layer is a second layer, and a layer immediately below the second layer is a third layer.

In the example of FIG. 2, a chip CP1 being one of elements (chips) in the chip layer CP corresponds to three frames FR1 to FR3 being part of elements (frames) of the frame layer FR. In addition, the frame FR2 being part of the elements in the frame layer FR corresponds to 18 blocks BL1 to BL18 being part of elements (blocks) in the block layer BL. The block BL9 being one of the elements in the block layer BL corresponds to four cells CL1 to CL4 being part of elements (cells) of the cell layer CL. The cell CL1 being part of the elements in the cell layer CL corresponds to plural figures FG1 and FG2 being part of elements (figures) in the figure layer FG.

Next, the aforementioned format check device 3c is described in more detail.

As illustrated in FIG. 1, the format check device 3c includes a format check part 31 configured to perform format check on drawing data in a first check, an information generation part 32 configured to generate encoded information on the drawing data having passed the format check and check information on the format check, an information storage part 33 configured to store the encoded information and the check information thus generated, a code inspection part 34 configured to check the above drawing data by using the encoded information in a second or subsequent check, an information inspection part 35 to inspect the check information, a check execution part 36 configured to execute check with processing details of the format check changed according to the inspection result, and an information update part 37 configured to update the check information in the information storage part 33.

Figure 3:
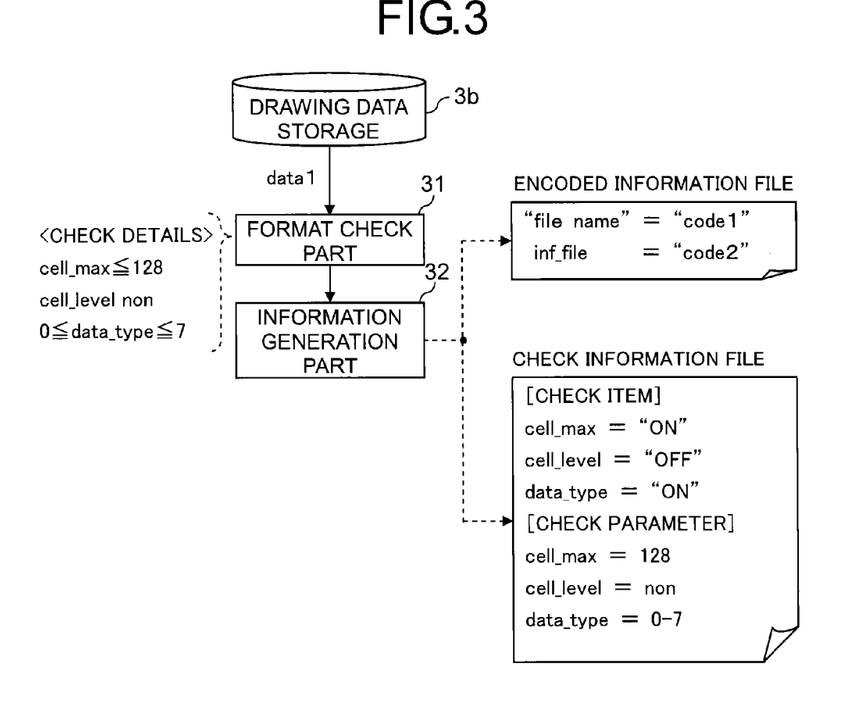
FIG. 3 is an explanatory diagram for explaining format check and information generation according to the first embodiment.

In the first format check, as illustrated in FIG. 3, the format check part 31 reads data 1 as drawing data from the drawing data storage 3b, and performs the format check on the data 1 based on check details. The check details set in the first format check include "cell_max≤128", "cell_level skip" and "0≤data_type≤7", for example.

As illustrated in FIG. 3, the information generation part 32 acquires code of the data 1 having passed the check and information on the format check (check details) from the format check part 31, and generates an encoded information file and a check information file of the data 1.

Here, when the data 1 passes the first format check, ""file name"="code1"" is written as the code of the data 1 in the encoded information file, for example. Moreover, in the check information file, "cell_max="ON"", "cell_level="OFF"" and "data_type="ON"" are written as [check item] and "cell_max=128", "cell_level=non" and "data_type=0-7 (a range of 0 to 7)" are written as [check parameter]. Lastly, "inf_file="code2"" is written as a code of the check information file in the encoded information file. Note that "cell_max" is a maximum size of a cell, "cell_level" is a cell_level (the larger a numeric value, the higher the level), and "data_type" is a type (kind) of data.

Returning to FIG. 1, the information storage part 33 stores the encoded information file and the check information file of the data 1 transmitted from the information generation part 32. For example, a magnetic disk device, a semiconductor disk device (flash memory) or the like can be used as the information storage part 33.

In the second or subsequent format check, the code inspection part 34 reads the data 1 as the drawing data from the aforementioned drawing data storage 3b, and reads the encoded information file of the data 1 from the information storage part 33. Then, the code inspection part 34 performs an error inspection of the data 1 (code inspection) by using the encoded information file, i.e., inspects whether the value of the data 1 matches the value of code1 of "file name" in the encoded information file. Moreover, the code inspection part 34 also performs an error inspection (code inspection) of the check information file by using the encoded information file, i.e., inspects whether the value of the check information file matches the value of code2 of "inf_file" in the encoded information file.

If there is no error in the data 1 and the check information file, i.e., if the data 1 and the check information file pass the inspection, the format check on the data 1 (check for all the check items in the check details) is omitted. On the other hand, if the data 1 or the check information file fails to pass the inspection, an error is notified of and then the format check on the data 1 (check for all the check items in the check details) is performed.

If the data 1 and the check information file pass the inspection, the information inspection part 35 inspects the check information file to detect a change in the check information file, or more specifically detect a change in the check details by comparing the check details in the check information file with current check details (check information file inspection). When detecting a change in the check details in the check information file, the information inspection part 35 sends the check execution part 36 a detection notification of the change and change information indicating how the check details are changed.

In response to the detection notification from the information inspection part 35, the check execution part 36 additionally performs the format check according to the change in the check information file, i.e., the changed check details (check items) on the basis of the change information sent from the information inspection part 35.

The information update part 37 applies the change based on the above change information to the check information file, and thereby updates the check information file (check information file update). Moreover, the information update part 37 rewrites the code of "inf_file" in the encoded information file, and thereby updates the encoded information file (encoded information file update).

Figure 4:
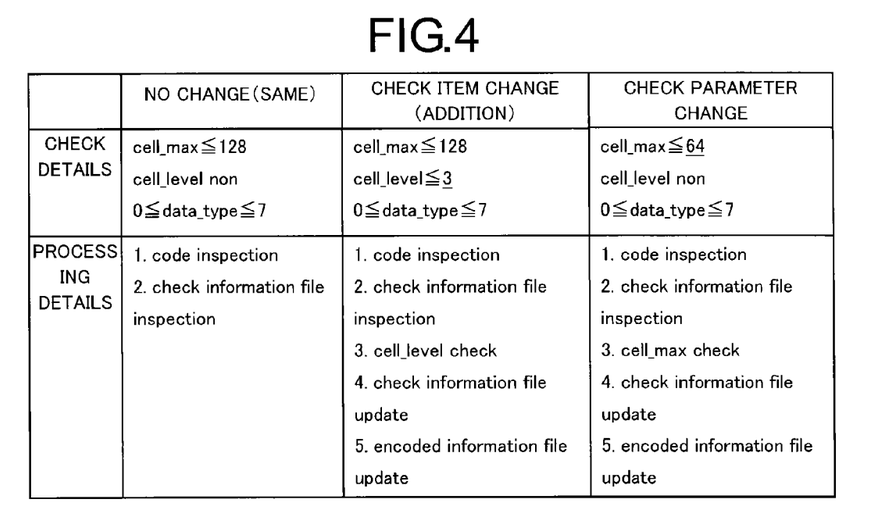
FIG. 4 is an explanatory diagram for explaining processing details in accordance with check details according to the first embodiment.

Here, in the second or subsequent check, for example as illustrated in FIG. 4, if the check details are not changed, the processing details include only "1. code inspection" and "2. check information file inspection". On the other hand, if a check item is changed (added), more specifically, if "cell_level" is changed from "skip" to "3", the processing details include not only "1. code inspection", and "2. check information file inspection", but also "3. cell_level check", "4. check information file update" and "5. encoded information file update". In addition, if the check parameter is changed, more specifically, if "cell_max" is changed from "128" to "64", the processing details include not only "1. code inspection", and "2. check information file inspection", but also "3. cell_max check", "4. check information file update" and "5. encoded information file update". Thus, the processing details are changed according to the check details.

In the code inspection described above, whether or not the values of the data 1 and code1 of "file name" match is inspected. If these values match, whether or not the values of the check information file and code2 of "inf_file" match is inspected. If these values match, whether or not a check item is changed is inspected based on the content of the check information file in the aforementioned check information file inspection. If there is a check item changed (or added) in the current check, the check for the changed check item is executed. Lastly, the check items and check parameters for which the check has been performed are written to the check information file, and thereby the check information file is updated. In response to this update, the code of "inf_file" in the encoded information file is also updated.

Incidentally, the aforementioned parts such as the format check part 31, the information generation part 32, the information storage part 33, the code inspection part 34, the information inspection part 35, the check execution part 36 and the information update part 37 may be configured of hardware such as electric circuits or software such as a program for executing the above functions, or further may be configured of a combination of hardware and software. In addition, the aforementioned check processing may be performed in either sequential processing (consecutive processing) or parallel processing. In the foregoing description, a pair of an encoded information file and a check information file is generated for one set of drawing data, but this is not the only way. For example, an encoded information file and a check information file may be generated for each chip in the drawing data.

Figure 5:
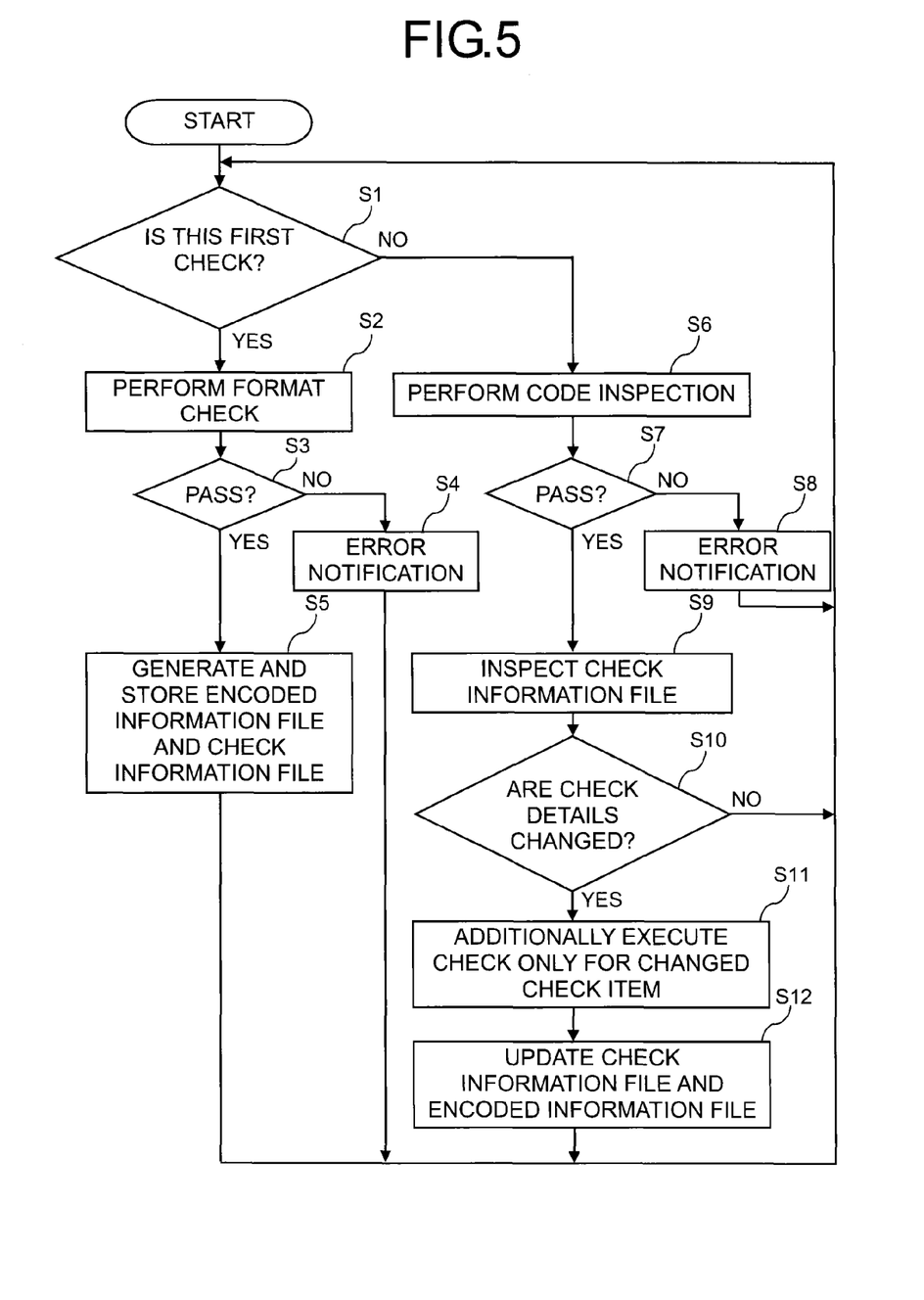
FIG. 5 is a flowchart illustrating a flow of check processing according to the first embodiment.

Next, with reference to FIG. 5, description is provided for a flow of check processing performed by the format check device 3c described above.

As illustrated in FIG. 5, it is judged whether the check is the first check or not (step S1). When it is judged that the check is the first check (YES in step S1), the format check part 31 reads data from the drawing data storage 3b and performs the format check on the data (step S2). Thereafter, whether the data passes the format check or not (step S3) is checked. If it is judged that the data does not pass the format check, i.e., fails the check (NO in step S3), an error indicating the failure is notified of (step 4) and then the processing is returned to step S1. On the other hand, if it is judged that the data passes the format check (YES in step S3), the information generation part 32 generates the encoded information file and the check information file of the data, and these files are stored in the information storage part 33 (step S5).

Here, for example as illustrated in FIG. 3, assuming that the check details include "cell_max≤128", "cell_level skip" and "0≤data_type≤7", code1 of the data 1 is written to the encoded information file if the data 1 passes the first format check. Moreover, in the check information file, "cell_max="ON"", "cell_level="OFF"" and "data_type="ON"" are written as [check item] and "cell_max=128", "cell_level=non" and "data_type=0-7" are written as [check parameter]. Thereafter, code2 of the check information file is written to the encoded information file.

If it is judged that the format check is not the first check, i.e., a second or subsequent check in the aforementioned step S1 (NO in step S1), the data is read from the drawing data storage 3b and the check information file is read from the information storage part 33. Then, the code inspection part 34 performs code inspection on the data and the check information file (step S6). After that, whether the data and the check information file pass the code inspection or not is judged (step S7). If it is judged that the data and the check information file do not pass the code inspection, i.e., fail the code inspection (NO in step S7), and an error indicating the failure is notified of (step S8) and the processing is returned to step S1. Here, when an error is notified of in step S4 or step S8, the format check for all the check items is performed on the data.

On the other hand, if it is judged that the data and the check information file pass the code inspection in step S7 described above (YES in step S7), the information inspection part 35 inspects the check information file (step S9), and judges whether or not the check details are changed (step S10). Thereafter, if it is judged that the check details are not changed (NO in step S10), the processing is returned to step S1. On the other hand, if it is judged that the check details are changed (YES in step S10), the check execution part 36 additionally executes the format check only for the changed check items (step S11). Subsequently, the information update part 37 updates both the check information file and the encoded information file (step S12), and the processing is returned to step S1.

Here, if a check item is changed ("cell_level" is added) as illustrated in FIG. 4, for example, "cell_level check" is additionally executed. Instead, if a check parameter is changed ("cell_max" is changed), "cell_max check" is additionally executed. Note that, irrespective of whether the check details are changed or not, the code inspection and the check information file inspection are performed. In this way, if there is no change in the check details, the format check to check all the check items can be omitted by execution of the code inspection, and thereby the check time can be reduced. Instead, if there is a change in the check details, the format check for the changed check item is executed while the format check for all the check items is omitted. This enables achievement of check time reduction and execution of rigorous check. In this way, both the rigorousness of the check and the efficiency of the processing can be both improved together.

As described above, according to the first embodiment, in the case where the drawing data is to be rechecked in the format check, the drawing data is inspected by using the stored encoded information, the stored check information is inspected if the drawing data passes the inspection, and then the format check is executed with the processing details of the format check changed according to the inspection result. Thus, the format check to check all the check items can be omitted by execution of the inspection using the encoded information, so that check time reduction can be achieved. Moreover, since the check is performed with the processing details of the format check changed according to the inspection result of the check information, the check with the processing details according to the inspection result can be executed, so that the rigorous check can be performed. For example, if the inspection of the check information detects a change in the check information, the check corresponding to the change can be performed. Thus, the rigorous check can be achieved.

In the above description, every time the check requirements (check details) are changed, the change is reflected in the check information file, and thereby the check information file is updated. However, the processing is not limited to this. For example, in the case where the same data is checked multiple times under different check requirements, the check information file may be updated by employing, as a value of the check information file, the value imposing the severest constraint among the values used in the multiple times of check. In this case, the check information file imposing severe check requirements is used and thereby more rigorous check can be achieved.

Figure 6:
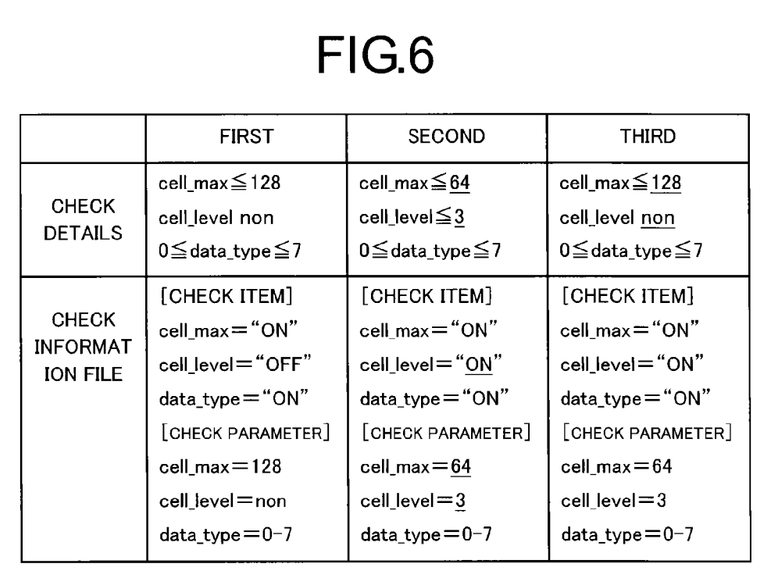
FIG. 6 is an explanatory diagram for explaining an example of an update of a check information file according to the first embodiment.

Here, for example as illustrated in FIG. 6, if the check details are changed from the first check to the second check, i.e., "cell_max" is changed from "128" to "64", and "cell_level" is changed from "skip" to "3", the check information file is changed such that "cell_level" is changed from "OFF" to "ON" in the check item, and "cell_max" is changed from "128" to "64" and "cell_level" is changed from "non" to "3" in the check parameter.

Thereafter, if the check details are changed from the second check to the third check, i.e., "cell_max" is changed from "64" to "128", and "cell_level" is changed from "3" to "skip", the check information file is supposed to be changed such that "cell_level" is changed from "ON" to "OFF" in the check item and "cell_max" is changed from "64" to "128" and "cell_level" is changed from "3" to "non" in the check parameter. However, since the values imposing the severest constraints are to be employed, the check information file remains unchanged, so that "cell_level" is still "ON" in the check item and "cell_max" is still "64" and "cell_level" is also still "3" in the check parameter.

Next, another example of the foregoing check processing is described. In the foregoing description, the format check device 3c performs data transfer to only one drawing unit 2. However, the processing is not limited to this. Here, description is herein provided for check processing in a case where data transfer is performed to multiple, e.g., two drawing units 2, for example. In this description, a first one of the two drawing units 2 is referred to as "Tool A", whereas the other second drawing unit 2 is referred to as "Tool B".

Figure 7:
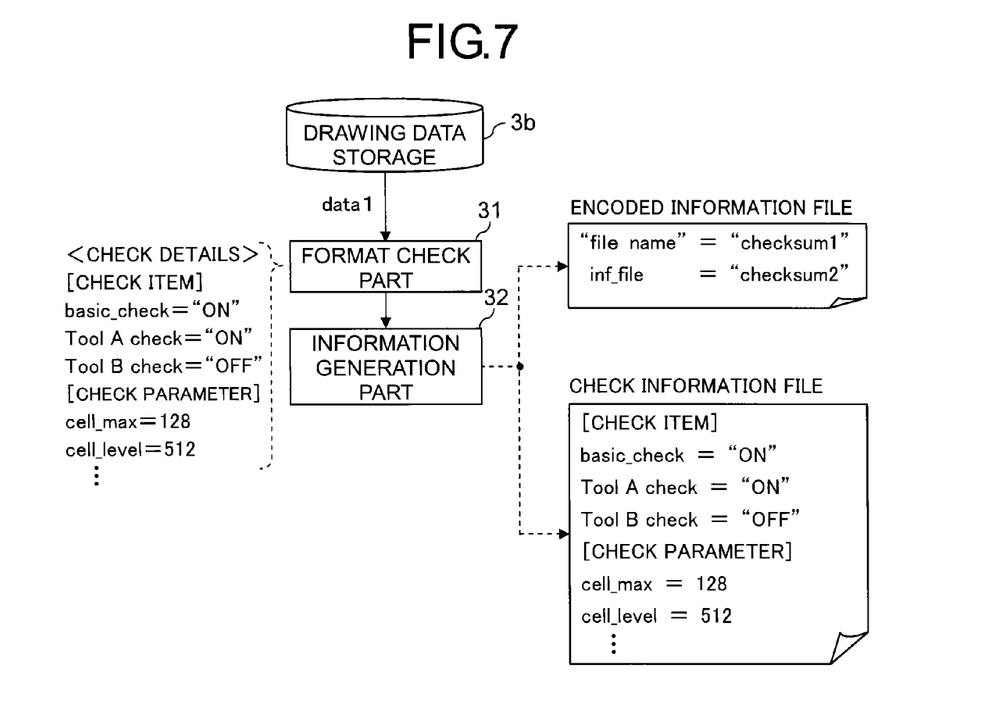
FIG. 7 is an explanatory diagram for explaining another example of the format check and the information generation according to the first embodiment.

In the first check, as illustrated in FIG. 7, the format check part 31 reads data 1 from the drawing data storage 3b and performs the format check based on the check details on the data 1. In the check details in the first check, "basic_check="ON"", "Tool A check="ON"" and "Tool B check="OFF"" are set as [check item], and "cell_max=128", "cell_level=512" and the like are set as [check parameter], for example. On the basis of these check details, "basic_check" and "Tool A check" are performed as the check for "Tool A".

Subsequently, if the data 1 passes the above check, the information generation part 32 generates the encoded information file and the check information file of the data 1. For example, ""file name"="checksum1"" is written as the code of the data 1 in the encoded information file. Moreover, in the check information file, "basic_check="ON"", "Tool A check="ON"" and "Tool B check="OFF"" are written as [check item], and "cell_max=128", "cell_level=512" and the like are written as [check parameter]. Lastly, in the encoded information file, ""inf_file"="checksum2"" is written as the code of the check information file.

Figure 8:
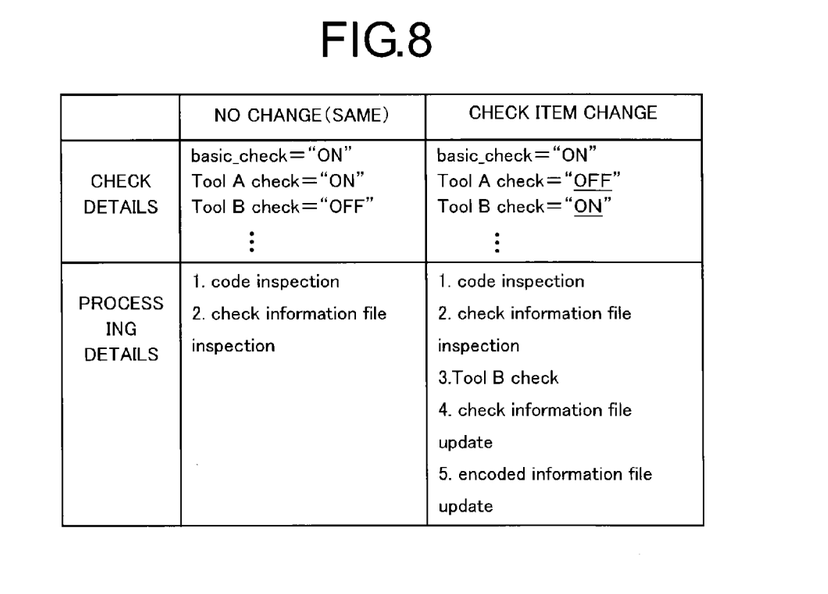
FIG. 8 is an explanatory diagram for explaining another example of the processing details in accordance with the check details according to the first embodiment.

Thereafter, in the second or subsequent check, for example as illustrated in FIG. 8, if the check details are not changed (in the case of data transfer to the first drawing unit), the processing details include "1. code inspection" and "2. check information file inspection" only. On the other hand, if the check items are changed (in the case of data transfer to the second drawing unit), i.e., if "Tool A check" is changed from "ON" to "OFF" and "Tool B check" is changed from "OFF" to "ON", the processing details include not only "1. code inspection" and "2. check information file inspection" but also "3. Tool B check", "4. check information file update" and "5. encoded information file update".

In the code inspection described above, whether or not the values of the data 1 and "checksum1" match is inspected. If these values match, whether or not the values of the check information file and "checksum2" match is inspected. If these values match, the check information file inspection is performed to inspect whether or not "basic_check" is performed from the content of the check information file. If it is judged that the check is performed, "Tool B check" is additionally performed as check for "Tool B". Then, "Tool B check="ON"" is written in the check information file, and thereby the check information file is updated. In response to this update, the code of "inf_file" in the encoded information file is also updated. In this way, if the check details are changed, the format check for the changed check item is performed while the format check to check all the check items is omitted. This enables achievement of check time reduction and execution of rigorous check.

(Second Embodiment)

A second embodiment is described with reference to FIGS. 9 to 12.

The second embodiment is basically the same as the first embodiment. In the second embodiment, points different from those in the first embodiment are described while the same units and parts as those described in the first embodiment are indicated by the same reference signs and the description thereof is omitted herein.

In the second embodiment, as the check information of data having passed the format check, the information generation part 32 does not generate the information on check details such as check items and check parameters, but generates check-targeted information by the format check, i.e., actual check-targeted information in data 1. The information storage part 33 stores the check-targeted information by the format check. The information inspection part 35 detects whether the check-targeted information is present or not in the information storage part 33. When the information inspection part 35 detects the presence of the check-targeted information, the check execution part 36 uses the check-targeted information stored in the information storage part 33 to execute check corresponding to the check-targeted information, i.e., check for a check item whose check-targeted information is present. On the other hand, when the information inspection part 35 does not detect the presence of the check-targeted information, the check execution part 36 executes the format check on the data 1 in a usual manner for a check item whose check-targeted information is not present.

Figure 9:
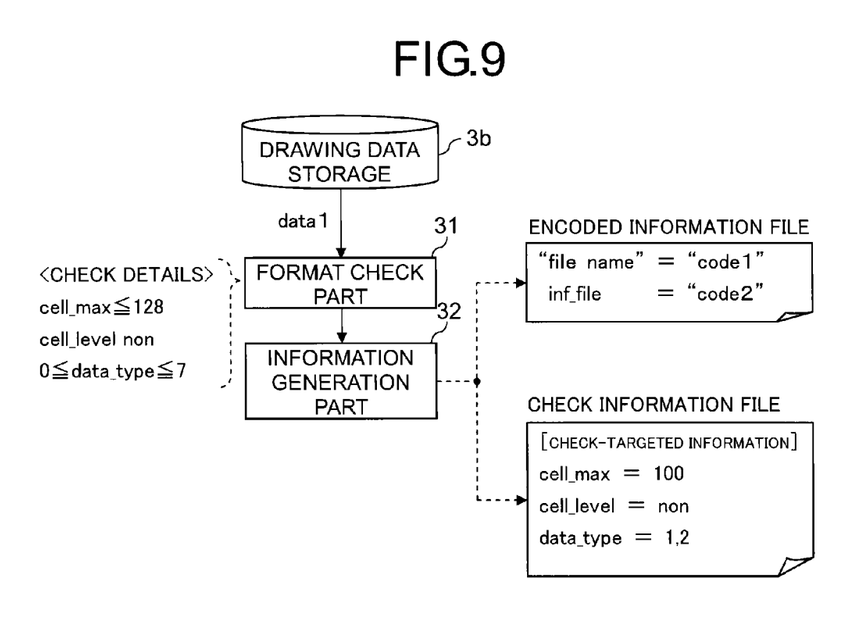
FIG. 9 is an explanatory diagram for explaining format check and information generation according to a second embodiment.

Here, for example as illustrated in FIG. 9, in the first check, the format check part 31 reads the data 1 from the drawing data storage 3b, and performs the format check based on the check details on the data 1. The check details set in the first check include "cell_max≤128", "cell_level skip" and "0≤data_type≤7", for example.

Then, if the data 1 passes the above check, the information generation part 32 generates the encoded information file and the check information file of the data 1. For example, when the data 1 passes the first format check, ""file name"="code1"" is written as the code of the data 1 in the encoded information file. In addition, in the check information file, "cell_max=100", "cell_level=non" and "data_type=1, 2" are written as [check-targeted information]. These pieces of information are check-targeted information obtained in the first format check, and include information such as 100 which is a cell maximum value contained in the data 1 and 1, 2 which are actual values contained in the data 1. Lastly, in the encoded information file, ""inf_file"="code2"" is written as the code of the check information file.

Figure 10:
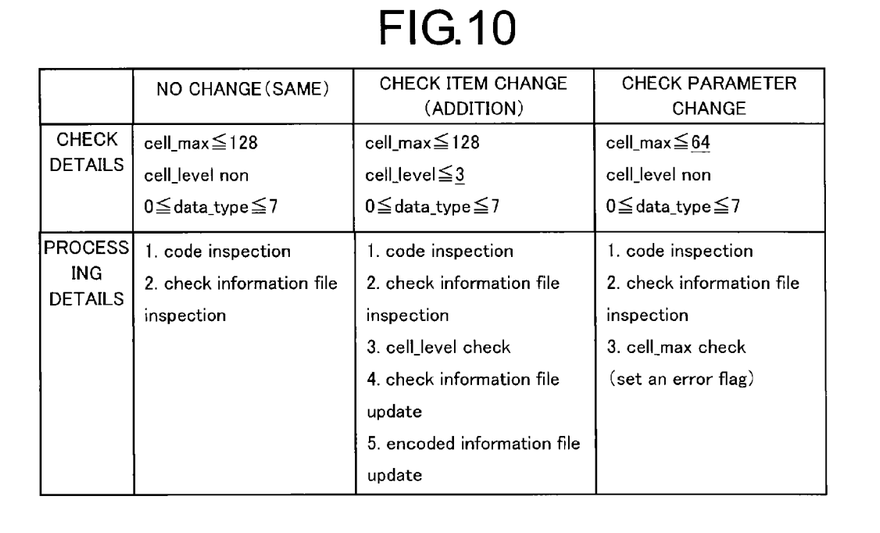
FIG. 10 is an explanatory diagram for explaining processing details in accordance with check details according to the second embodiment.

Thereafter, in the second or subsequent check, for example as illustrated in FIG. 10, if the check details are not changed, the processing details include only "1. code inspection" and "2. check information file inspection". On the other hand, if a check item is changed (added), more specifically, if "cell_level" is changed from "skip" to "3", the processing details include not only "1. code inspection" and "2. check information file inspection", but also "3. cell_level check", "4. check information file update" and "5. encoded information file update". In addition, if the check parameter is changed, more specifically, if "cell_max" is changed from "128" to "64", the processing details include not only "1. code inspection" and "2. check information file inspection", but also "3. cell_max check". Thus, the processing details are changed according to the check details.

In the code inspection described above, whether or not the values of the data 1 and code1 of "file name" match is inspected. If these values match, whether or not the values of the check information file and code2 of "inf_file" match is inspected. If these values match, the check information file inspection is performed to inspect whether or not the check-targeted information is present for the current check based on the content of the check information file. If the presence is detected, the check is performed by using the existing check-targeted information. A change in the check details can be recognized by detecting the presence or absence of the check-targeted information. Note that check on the data 1 for a check item whose check-targeted information is not present is performed in the usual manner. Lastly, the check item for which the check has been performed by reading the data 1 is additionally written as the check-targeted information to the check information file, and the code of "inf_file" in the encoded information file is also updated.

In "cell_level check" mentioned above, the check on the data 1 is performed based on "cell_level≤3" because "cell_level=non" is written for cell_level in the check information file (see FIG. 9) and the check-targeted information of cell_level is not present. In addition, in "cell_max check" mentioned above, the check is performed by using the actual check-targeted information instead of the original information of the data 1 because "cell_max=100" is written for cell_max in the check information file (see FIG. 9) and the check-targeted information of cell_max is present. Here, the check details indicate "cell_max≤64" while the check-targeted information in the check information file indicates "cell_max=100". In this case, since "cell_max" is larger than 64, the data 1 fails the check and an error flag is set (error notification). This check is performed by not using the original information of the data 1 (for example, binary data) but using the actual check-targeted information in the check information file (for example, text data), and therefore the processing time can be reduced in comparison with the case where check is performed by using the original information of the drawing data (such as a case where the processing is performed by reading the binary data).

As described above, the second embodiment can produce the same effects as the foregoing first embodiment, and therefore can achieve check time reduction and rigorous check. In addition, since the actual check-targeted information is used to execute the check corresponding to the check-targeted information, the processing time can be reduced as compared with a case where the original information of the drawing data is used, such as a case where the processing is performed by reading the binary data, for example.

Here, another example of the foregoing check processing is described. In the above description, the data type in the check details is set to "0≤data_type≤7", but is not limited to this. Here, description is provided for the check processing using a file (text file) specifying a range of data type.

Figure 11:
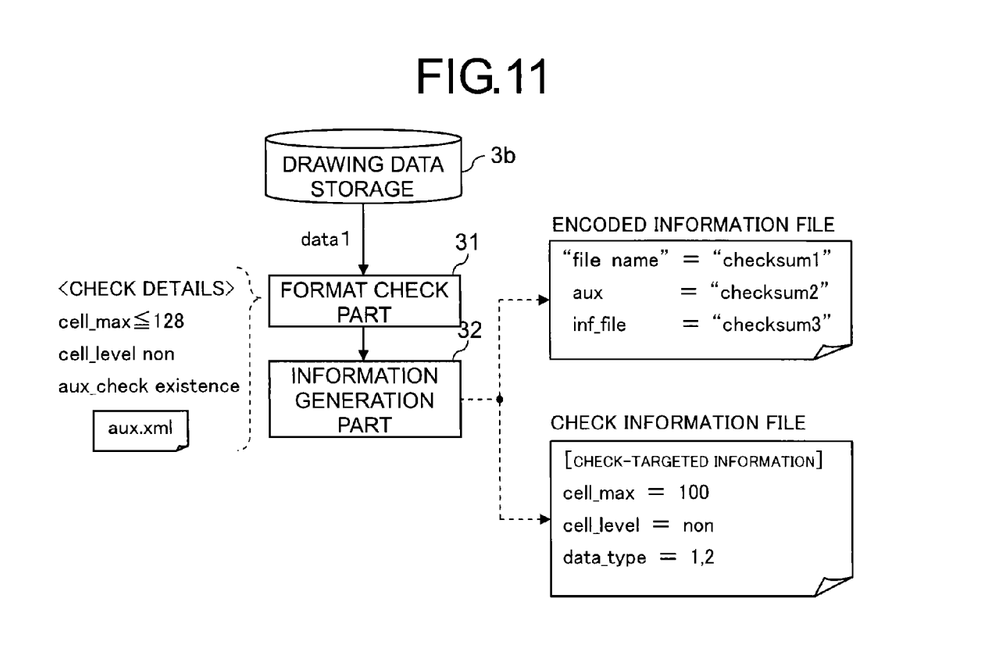
FIG. 11 is an explanatory diagram for explaining another example of the format check and the information generation according to the second embodiment.

In the first check, as illustrated in FIG. 11, the format check part 31 reads data 1 from the drawing data storage 3b, and performs the format check based on the check details on the data 1. As the check details in this check, for example, "cell_max≤128", "cell_level skip" and "aux_check execute" are set, and additionally an aux.xml file is inputted. This file defines a range of data_type of the data 1. Based on these check details, "aux_check" is executed to check the data 1 and the aux.xml file.

Subsequently, if the data 1 and the aux.xml file pass the above check, the information generation part 32 generates the encoded information file and the check information file. For example, when the data 1 passes the first format check, the encoded information file is generated in which ""file name"="checksum1"" is written as the code of the data 1 and "aux="checksum2"" is additionally written as the code of the aux.xml file. Further, "cell_max=100", "cell_level=non" and "data_type=1, 2" are written as [check-targeted information] in the check information file. These pieces of information are check-targeted information obtained in the first format check, and include information such as 100 which is a cell maximum value contained in the data 1 and 1, 2 which are actual values contained in the data 1. Lastly, in the encoded information file, ""inf_file"="checksum3"" is written as the code of the check information file.

Figure 12:
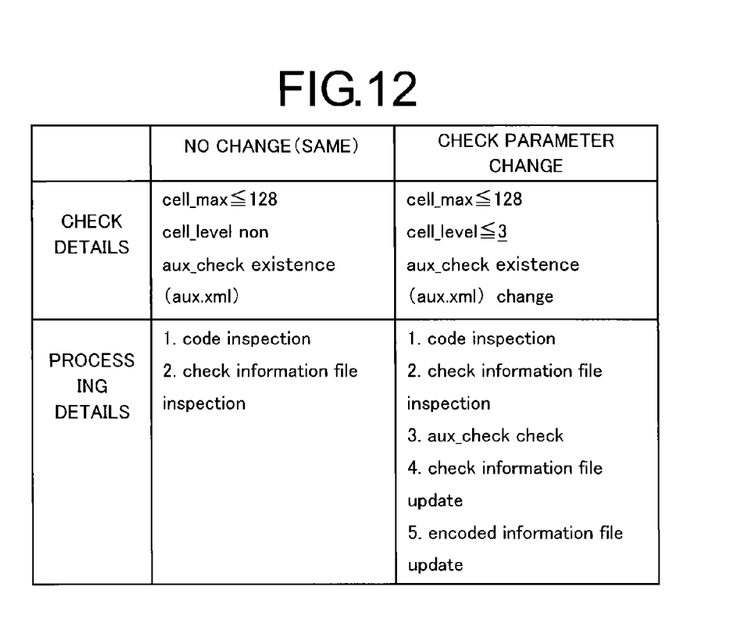
FIG. 12 is an explanatory diagram for explaining another example of the processing details in accordance with the check details according to the second embodiment.

Thereafter, in the second or subsequent check, for example as illustrated in FIG. 12, if the check details are not changed, the processing details include only "1. code inspection" and "2. check information file inspection". On the other hand, if a check parameter is changed, i.e., if the aux.xml file is changed, the processing details include not only "1. code inspection" and "2. check information file inspection", but also "3. aux_check check", "4. check information file update" and "5. encoded information file update".

In the code inspection described above, whether or not the values of the data 1 and "checksum1" match and whether or not the values of the aux.xml file and "checksum2" match are inspected. If the values of the data 1 and "checksum1" match but the values of the aux.xml file and "checksum2" do not match, whether or not the values of the check information file and "checksum3" match is inspected. If these values match, the check information file inspection is performed to judge whether or not "data_type" is written in the check information file on the basis of the content of the check information file. If it is judged that "data_type" is written, "aux_check" based on the written "data_type" is executed. If the data 1 passes this check, the code of "aux" in the encoded information file is updated.

In "aux_check" mentioned above, since the check information file (see FIG. 11) contains "data_type=1, 2" and thus the check-targeted information is present, the check is executed by using the actual check-targeted information instead of the original information in the data 1. Here, the check is executed by comparing the numeric values 1 and 2 of "data_type" with the range of data_type defined in the aux.xml file. This makes it possible to reduce the processing time in comparison with a case where the original information in the drawing data is used, for example, a case where the processing needs to be performed by reading the binary data.

(Third Embodiment)

A third embodiment is described with reference to FIG. 13.

A pattern inspection apparatus according to a third embodiment includes the format check device in the first embodiment. In the third embodiment, points different from those in the first embodiment are described while the same units and parts as those described in the first embodiment are indicated by the same reference signs and the description thereof is omitted. Note that, the format check device in the second embodiment may be used in place of the format check device of the first embodiment.

Figure 13:
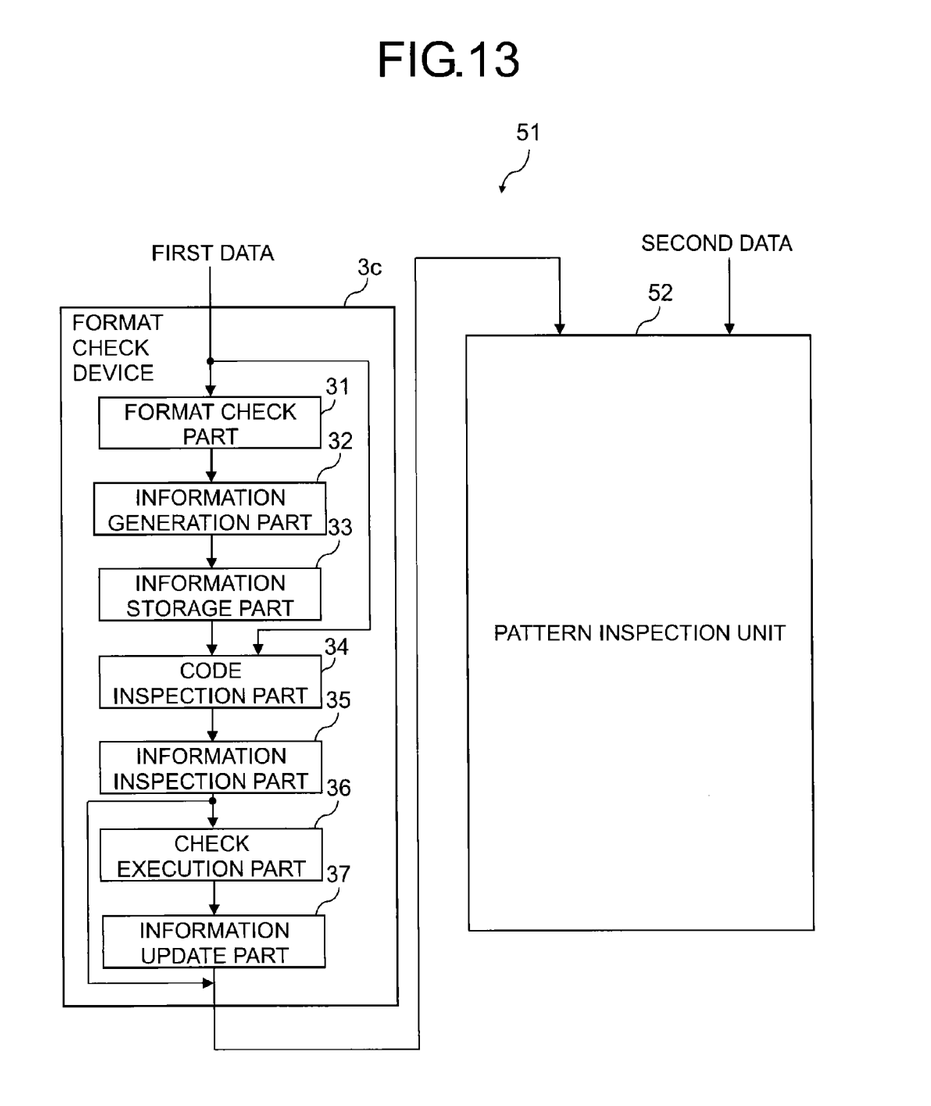
FIG. 13 is a diagram illustrating a schematic configuration of a pattern inspection apparatus according to a third embodiment.

As illustrated in FIG. 13, a pattern inspection apparatus 51 according to the third embodiment includes the format check device 3c of the first embodiment, and a pattern inspection unit 52 configured to inspect patterns. The format check device 3c receives input of first data (drawing data) obtained by converting layout data (design data, CAD data or the like) of a semiconductor integrated circuit or the like, for example. The pattern inspection unit 52 receives input of the first data having passed the format check performed by the format check device 3c, and input of second data (drawing data) generated based on a pattern that the charged particle beam drawing apparatus 1 has actually drawn on a sample W.

The first data is inputted to the format check device 3c through a wired or wireless network from a storage device (not illustrated) such as a database where the first data is stored, and then is inputted to the pattern inspection unit 52 after passing the format check. In a similar manner, the second data is also inputted to the pattern inspection unit 52 through a wired or wireless network from a storage device (not illustrated) such as a database where the second data is stored. Like the drawing data in the first embodiment, these first and second data also have a layered structure including, for example, a chip layer CP, a frame layer FR, a block layer BL, a cell layer CL and a figure layer FG (see FIG. 2).

The format check device 3c checks the format of the inputted first data in the same way as the first embodiment. Here, if the first data passes the check, the format check device 3c sends the passed first data to the pattern inspection unit 52 in the next stage. On the other hand, if the first data fails, the format check device 3c sets an error flag (error notification).

The pattern inspection unit 52 inspects the pattern or the like actually drawn on the sample W by the charged particle beam drawing apparatus 1, on the basis of the inputted first and second data. This inspection is performed by, for example, comparing the pattern actually drawn and the drawing data converted from the layout data.

As described above, the third embodiment can produce the same effects as those in the foregoing first embodiment, and therefore can achieve check time reduction and rigorous check. In addition, if the format check device 3c in the second embodiment is used in place of the format check device 3c in the first embodiment, the third embodiment can produce the same effects as those in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
   a processing circuit that is programmed to perform the functions of
      a format check part performing a first format check based on first check details on drawing data having a layered structure, the first check details identifying requirements for the drawing data to be verified by the first format check,
      an information generation part generating encoded information on the drawing data and check information based on a result of the first format check, if the drawing data passes the first format check performed by the format check part,
      an information storage part storing the encoded information and the check information generated by the information generation part,
      a code inspection part inspecting the encoded information stored by the information storage part, when the drawing data is to be rechecked,
      an information inspection part inspecting the check information stored by the information storage part and judging whether or not the check information has changed since the execution of the first format check if the drawing data passes the inspection performed by the code inspection part, and
      a check execution part executing a second format check on the drawing data with second check details if the information inspection part detects that the check information has changed, the second check details identifying requirements for the drawing data to be verified by the second format check, wherein
      the second check details of the second format check are different from the first check details of the first format check.

2. The charged particle beam drawing apparatus according to claim 1, wherein
   the information generation part generates, as the check information, check-targeted information obtained in the first format check,
   if the information inspection part detects the presence of the check-targeted information, the check execution part uses the check-targeted information stored by the information storage part to execute the second format check corresponding to the check-targeted information.

3. The charged particle beam drawing apparatus according to claim 1, further comprising an information update part reflecting the change in the check information in the check information stored by the information storage part, and thereby updating the check information stored by the information storage part, if the information inspection part detects a change in the check information.

4. The charged particle beam drawing apparatus according to claim 2, further comprising an information update part reflecting the change in the check information stored by the information storage part, and thereby updating the check information stored by the information storage part, if the information inspection part detects the change in the check information.

5. The charged particle beam drawing apparatus according to claim 3, wherein
   in response to an update of the check information, the information update part updates the encoded information stored by the information storage part.

6. The charged particle beam drawing apparatus according to claim 4, wherein
   in response to an update of the check information, the information update part updates the encoded information stored by the information storage part.

7. A format check apparatus comprising:
   a processing circuit that is programmed to perform the functions of
      a format check part performing a first format check based on first check details on drawing data having a layered structure, the first check details identifying requirements for the drawing data to be verified by the first format check,
      an information generation part generating encoded information on the drawing data and check information based on a result of the first format check, if the drawing data passes the first format check performed by the format check part,
      an information storage part storing the encoded information and the check information generated by the information generation part,
      a code inspection part inspecting the encoded information stored by the information storage part, when the drawing data is to be rechecked,
      an information inspection part inspecting the check information stored by the information storage part and judging whether or not the check information has changed since execution of the first format check if the drawing data passes the inspection performed by the code inspection part, and
      a check execution part executing a second format check on the drawing data with second check details according to an inspection result obtained by the information inspection part, the second check details identifying requirements for the drawing data to be verified by the second format check, wherein the second check details of the second format check are different from the first check details of the first format check.

8. The format check apparatus according to claim 7, wherein
the information generation part generates, as the check information, check-targeted information obtained in the first format check,
if the information inspection part detects the presence of the check-targeted information, the check execution part uses the check-targeted information stored by the information storage part to execute the second format check corresponding to the check-targeted information.

9. The format check apparatus according to claim 7, further comprising an information update part reflecting the change in the check information in the check information stored by the information storage part, and thereby updating the check information stored by the information storage part, if the information inspection part detects a change in the check information.

10. The format check apparatus according to claim 8, further comprising an information update part reflecting the change in the check information stored by the information storage part, and thereby updating the check information stored by the information storage part, if the information inspection part detects the change in the check information.

11. The format check apparatus according to claim 9, wherein
in response to an update of the check information, the information update part updates the encoded information stored by the information storage part.

12. The format check apparatus according to claim 10, wherein
in response to an update of the check information, the information update part updates the encoded information stored by the information storage part.

13. A format check method, which is executed on a programmed processing circuit, comprising the steps of:
performing a first format check based on first check details on drawing data having a layered structure, the first check details identifying requirements for the drawing data to be verified by the first format check;
generating encoded information on the drawing data and check information based on a result of the first format check, if the drawing data passes the first format check;
storing the encoded information and the check information thus generated;
inspecting the stored encoded information when the drawing data is to be rechecked;
inspecting the stored check information and judging whether or not the check information has changed since execution of the first format check if the drawing data passes the inspection using the encoded information; and
executing a second format check on the drawing data with second check details if it is judged that the check information has changed, the second check details identifying requirements for the drawing data to be verified by the second format check, wherein
the second check details of the second format check are different from the first check details of the first format check.

14. The format check method according to claim 13, wherein
the check information generated in the step of generating the check information is check-targeted information obtained in the first format check,
if the presence of the check-targeted information is detected in the step of inspecting the check information, the stored check-targeted information is used to execute the second format check corresponding to the check-targeted information in the step of executing the second format check with the processing details changed.

15. The format check method according to claim 13, further comprising the step of, if a change in the check information is detected in the step of inspecting the check information, updating the stored check information by reflecting the change in the check information in the stored check information.

16. The format check method according to claim 14, further comprising the step of, if a change in the check information is detected in the step of inspecting the check information, updating the stored check information by reflecting the change in the check information in the stored check information.

17. The format check method according to claim 15, wherein
in the step of updating the check information, the stored encoded information is updated in response to an update of the check information.

* * * * *